(12) United States Patent
Namba et al.

(10) Patent No.: US 9,847,730 B2
(45) Date of Patent: Dec. 19, 2017

(54) POWER CONVERTER

(71) Applicant: Hitachi Automotive Systems, Ltd., Hitachinaka-shi, Ibaraki (JP)

(72) Inventors: Akihiro Namba, Tokyo (JP); Keisuke Fukumasu, Tokyo (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 14/911,847

(22) PCT Filed: May 28, 2014

(86) PCT No.: PCT/JP2014/064049
§ 371 (c)(1),
(2) Date: Feb. 12, 2016

(87) PCT Pub. No.: WO2015/025579
PCT Pub. Date: Feb. 26, 2015

(65) Prior Publication Data
US 2016/0197557 A1    Jul. 7, 2016

(30) Foreign Application Priority Data
Aug. 23, 2013 (JP) ................................ 2013-173327

(51) Int. Cl.
*H02M 3/335*    (2006.01)
*H02M 1/14*    (2006.01)
(Continued)

(52) U.S. Cl.
CPC ........... *H02M 3/33546* (2013.01); *B60L 1/00* (2013.01); *H01F 17/062* (2013.01); *H01F 27/40* (2013.01);
(Continued)

(58) Field of Classification Search
CPC .......... B60L 1/00; H01F 17/062; H01F 27/40; H01F 37/00; H02M 1/14; H02M 1/40;
(Continued)

(56) References Cited

U.S. PATENT DOCUMENTS 6,362,986 B1 * 3/2002 Schultz ................. H02M 3/158
363/132
6,930,457 B2 * 8/2005 Zack ..................... H02K 11/02
318/139

(Continued)

FOREIGN PATENT DOCUMENTS

JP   64-081661      3/1989
JP   2006-186950 A  7/2006
(Continued)

OTHER PUBLICATIONS

PCT International Search Report on application PCT/JP2014/064049 dated Aug. 19, 2014; 2 pages.

*Primary Examiner* — Fred E Finch, III
*Assistant Examiner* — Demetries A Gibson
(74) *Attorney, Agent, or Firm* — Foley & Lardner LLP

(57) ABSTRACT

Provided is a power converter in which a magnetic core of a noise filter can be prevented from magnetic saturation and the noise filter can be downsized. A noise filter 140 provided in a power converter includes: a magnetic core 1 formed with a single through-hole 1A and forming a closed magnetic circuit; first wiring 11 having one end 81 connected to a power conversion circuit and the other end drawn out from the second opening 3, and running through the through-hole 1A from one first opening 2 to the other second opening 3; second wiring 21 having one end connected to the other end of the first wiring 11 and the other end 82 drawn out from the first opening 2 as a filter output end, and running through the through-hole 1A from the second opening 3 to the first opening 2; a first capacitor 41 provided between the ground (Continued)

and a connecting portion 31 of the first wiring 11 and the second wiring 21; and the second capacitor 51 provided between the other end 82 of the second wiring 21 and the ground.

4 Claims, 13 Drawing Sheets

(51) Int. Cl.
    *H02M 7/00*    (2006.01)
    *H02M 3/28*    (2006.01)
    *H03H 7/09*    (2006.01)
    *B60L 1/00*    (2006.01)
    *H02M 1/40*    (2007.01)
    *H02M 3/337*    (2006.01)
    *H02M 1/44*    (2007.01)
    *H01F 17/06*    (2006.01)
    *H01F 27/40*    (2006.01)
    *H01F 37/00*    (2006.01)
    *H03H 1/00*    (2006.01)
    *H03H 7/01*    (2006.01)

(52) U.S. Cl.
    CPC .............. *H01F 37/00* (2013.01); *H02M 1/14* (2013.01); *H02M 1/40* (2013.01); *H02M 1/44* (2013.01); *H02M 3/28* (2013.01); *H02M 3/337* (2013.01); *H02M 7/003* (2013.01); *H03H 7/09* (2013.01); *H03H 2001/0057* (2013.01); *H03H 2007/013* (2013.01)

(58) Field of Classification Search
    CPC ...... H02M 1/44; H02M 3/28; H02M 3/33546; H02M 3/337; H03H 2001/0057; H03H 2007/013; H03H 7/09
    See application file for complete search history.

(56) References Cited

U.S. PATENT DOCUMENTS

| | | | |
|---|---|---|---|
| 9,214,264 B2* | 12/2015 | Chandrasekaran | H01F 3/14 |
| 9,425,686 B2* | 8/2016 | Zheng | H02M 1/44 |
| 2002/0017976 A1* | 2/2002 | Okamoto | H01F 17/04 |
| | | | 336/229 |
| 2006/0139971 A1 | 6/2006 | Suzuki | |
| 2006/0221655 A1* | 10/2006 | Nakahori | H02M 1/14 |
| | | | 363/47 |
| 2014/0266507 A1* | 9/2014 | Fauer | H02M 1/10 |
| | | | 333/181 |

FOREIGN PATENT DOCUMENTS

| | | |
|---|---|---|
| JP | 2006-211875 | 8/2006 |
| JP | 2007-209072 A | 8/2007 |
| JP | 2008-172442 A | 7/2008 |
| JP | 2008-219102 A | 9/2008 |

* cited by examiner (a)

(b)

POWER CONVERTER

TECHNICAL FIELD

The present invention relates to a power converter mounted with a noise filter.

BACKGROUND ART

An electric vehicle or a plug-in hybrid vehicle includes: an inverter device to drive a motor with a high-voltage storage battery for power drive; and a low-voltage storage battery to operate auxiliary machines such as a light and a radio of the vehicle. This kind of vehicle is mounted with a DC-DC converter device that performs power conversion from the high-voltage storage battery to the low-voltage storage battery or power conversion from the low-voltage storage battery to the high-voltage storage battery.

The DC-DC converter device includes a high-voltage side switching circuit to convert high-voltage DC voltage to AC voltage, a transformer to convert high AC voltage to low AC voltage, and a low-voltage side rectifier circuit to convert low-voltage AC voltage to DC voltage. In such a DC-DC converter device that converts the voltage by switching a semiconductor device, switching noise generated by switching is needed to be suppressed and a noise filter is needed to be mounted on an output unit.

The DC-DC converter is downsized year after year, and downsizing of the noise filter to be mounted is also demanded. As an example of such downsizing, there is a known structure disclosed in PTL 1, for example. The invention disclosed in PTL 1 provides an LC filter device that can have multistage connection by forming a structure in which a coil portion can be integrated.

CITATION LIST

Patent Literature

PTL 1: Publication of Japanese Patent Laid-Open No. 2008-172442 A

SUMMARY OF INVENTION

Technical Problem

A magnetic flux formed by current flowing in a coil of a noise filter forms a closed magnetic circuit inside a magnetic core. However, in the DC-DC converter required to output high DC current, a large-sized magnetic core is needed to be used such that the magnetic core is prevented from magnetic saturation even in the case where magnetic flux density is increased inside the magnetic core due to increase of output current. Due to this, the size of the noise filter is increased, and a factor to hinder downsizing of the DC-DC converter is caused.

Solution to Problem

The invention according to claim 1 is a power converter that includes: a switching circuit for power conversion having a switching device; and a noise filter provided on a direct current side of the switching circuit and adapted to remove noise. The noise filter includes: a magnetic core formed with a single through-hole and forming a closed magnetic circuit; first wiring running through the through-hole from one first opening to the other second opening thereof, and having one end connected the switching circuit and the other end drawn out from the second opening; second wiring running through the through-hole from the second opening to the first opening thereof, and having one end connected to the other end of the first wiring and the other end drawn out from the first opening as a filter output end; a first capacitor provided between ground and a connecting portion of the first wiring and the second wiring; and a second capacitor provided between the other end of the second wiring and the ground.

Advantageous Effects of Invention

According to the present invention, the magnetic core of the noise filter can be prevented from magnetic saturation in the power converter mounted with the noise filter, and the power converter can be downsized.

DESCRIPTION OF EMBODIMENTS

In the following, embodiments to implement the present invention will be described below with reference to the drawings.

First Embodiment

In the present embodiment, a DC-DC converter device mounted with a noise filter will be described as an example of a power converter according to the present invention. The DC-DC converter device according to the present embodiment is applied to an electric vehicle, a plug-in hybrid vehicle, and the like. A low-voltage storage battery to operate auxiliary machines such as a light and a radio is mounted on a vehicle, and the DC-DC converter device performs power conversion from a high-voltage storage battery to the low-voltage storage battery and power conversion from the low-voltage storage battery to the high-voltage storage battery.

[Circuit Configuration of DC-DC Converter Device]

Figure 1:
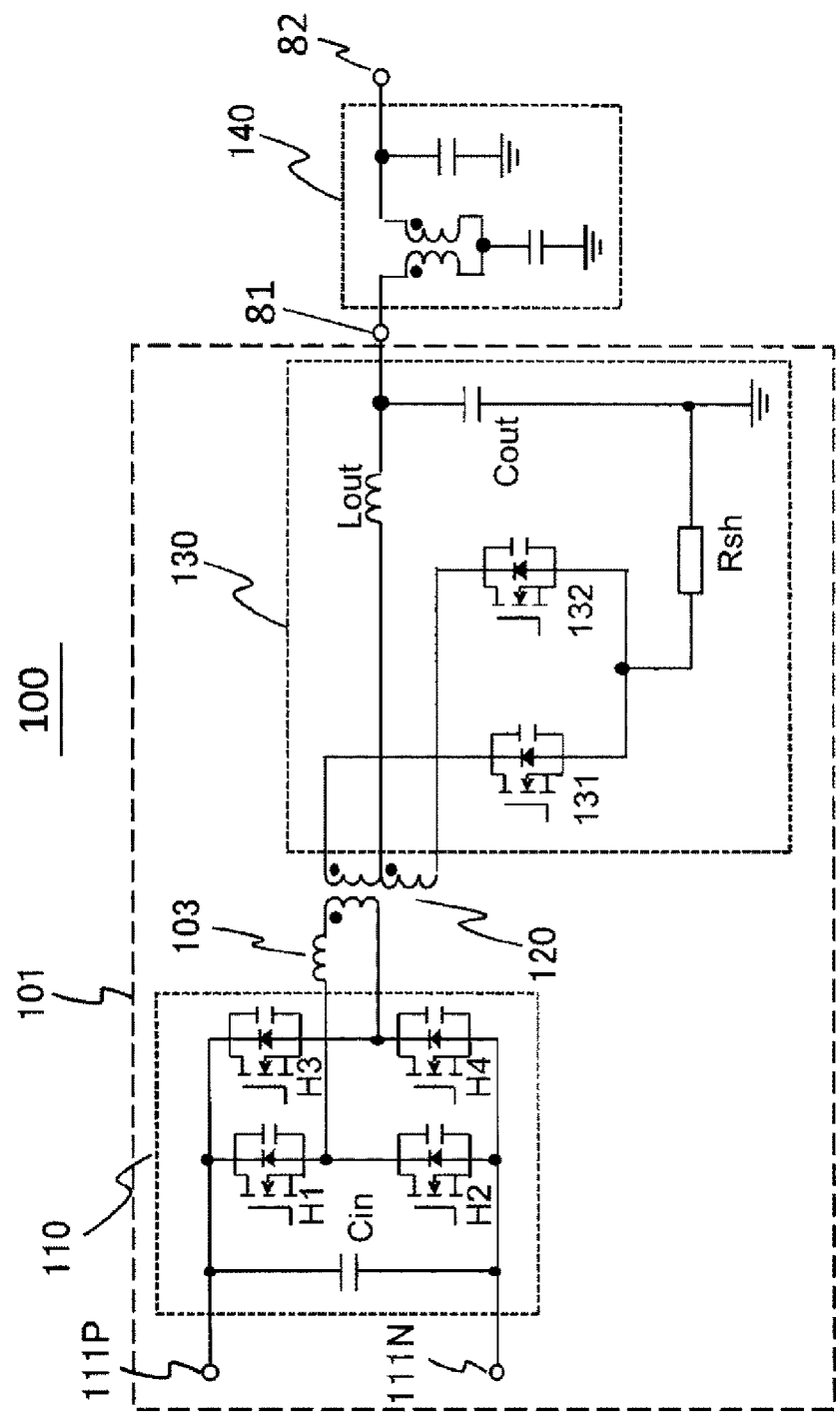
FIG. 1 is a diagram illustrating an exemplary circuit configuration of a DC-DC converter device 100.

FIG. 1 is a diagram illustrating an exemplary circuit configuration of a DC-DC converter device 100. The DC-DC converter device 100 includes a power conversion circuit 101 and a noise filter 140. The power conversion circuit 101 includes a high-voltage side switching circuit 110, a transformer 120, and a low-voltage side rectifier circuit 130. The high-voltage side switching circuit 110 converts, to AC voltage, high-voltage DC voltage received from high-voltage input terminals 111P, 111N. The transformer 120 converts high AC voltage to low AC voltage. The low-voltage side rectifier circuit 130 converts low-voltage AC voltage to DC voltage. The low-voltage DC voltage converted by the low-voltage side rectifier circuit 130 is output from a filter output end 82 via the noise filter 140.

(Circuit Configuration of High-voltage Side Switching Circuit)

The high-voltage side switching circuit 110 includes four semiconductor switching devices H1 to H4 connected as an H-bridge type, and a smoothing input capacitor Cin. For the semiconductor switching device, a MOSFET (field-effect transistor) is used, for example. Further, for the semiconductor switching devices H1 to H4, snubber capacitors are provided in parallel to the respective semiconductor switching devices H1 to H4. AC voltage is generated in a primary side of the transformer 120 by performing phase shift PWM control for the four semiconductor switching devices H1 to H4 of the high-voltage side switching circuit 110.

Meanwhile, a resonance choke coil 103 is connected between the high-voltage side switching circuit 110 and the transformer 120. Zero-voltage switching can be performed in the semiconductor switching devices H1 to H4 constituting the high-voltage side switching circuit 110 by using combined inductance of inductance of the resonance choke coil 103 and leakage inductance of the transformer 120.

(Circuit Configuration of Low-Voltage Side Rectifier Circuit)

The low-voltage side rectifier circuit 130 includes two rectifier phases formed of MOSFETs and a smoothing circuit including a choke coil Lout and a smoothing capacitor Cout. In the following, a rectifier phase formed by a MOSFET 131 will be referred to as a first rectifier phase, and a rectifier phase formed by a MOSFET 132 will be referred to as a second rectifier phase.

Wiring on a high-potential side in each of the rectifier phases (namely, a drain side of the MOSFET) is connected to a secondary side of the rectifier phase 120. Further, wiring on a low-potential side (ground side) in each of the rectifier phases is joined and connected to the ground via a shunt resistor Rsh. A secondary side center tap terminal of the transformer 120 is connected to the choke coil Lout, and the smoothing capacitor Cout is connected to an output side of the choke coil Lout.

Full-wave rectification is performed by the above-described two rectifier phases for alternate current generated on the secondary side of the transformer 120 by phase shift PWM control in the high-voltage side switching circuit 110. After the full-wave rectification, the alternate current is smoothed by the choke coil Lout and the smoothing capacitor Cout and becomes direct current/voltage. The shunt resistor Rsh is provided in order to detect load current returning from the ground, and indicates, in principle, a current value same as the load current flowing in the choke coil Lout. In other words, the DC-DC converter device 100 according to the present embodiment detects current in the choke coil Lout, and feeds back the value to a control circuit, thereby achieving control of output load current.

[Structure and Effects of Noise Filter 140]

Figure 2:
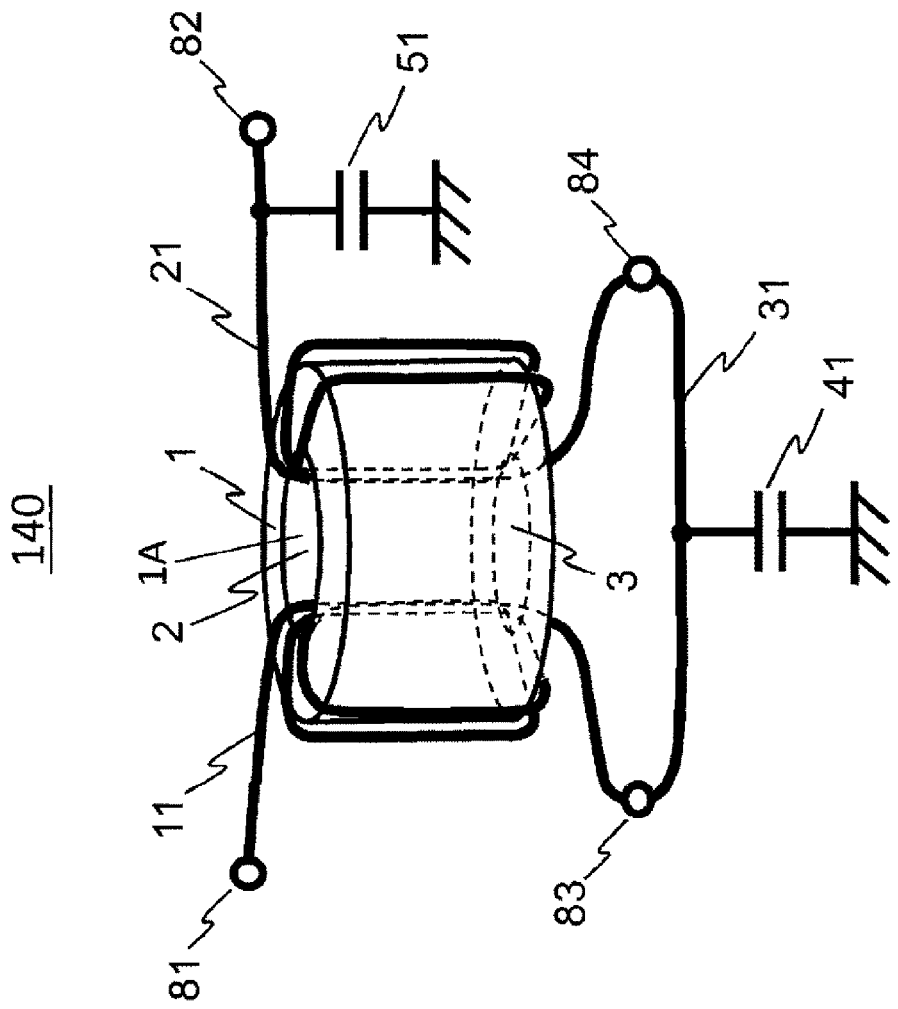
FIG. 2 is a diagram illustrating a wiring structure of a noise filter 140 according to the present embodiment.

FIG. 2 is a diagram illustrating a wiring structure of the noise filter 140 according to the present embodiment. The noise filter 140 includes a magnetic core 1, first wiring 11 and second wiring 21 both wound around the magnetic core 1, and capacitors 41, 51. A through-hole 1A is formed on the magnetic core 1 that forms a closed magnetic circuit. A first opening 2 is formed on one side of the through-hole 1A (upper side in the drawing) and a second opening 3 is formed on the other side of the through-hole 1A (lower side in the drawing).

The first wiring 11 is wound around the magnetic core 1 in a manner running through the through-hole 1A. An end of the first wiring 11 drawn out from the first opening 2 constitutes a filter input end 81. The filter input end 81 is connected to an output end of the low-voltage side rectifier circuit 130, namely, an output end of the power conversion circuit 101. On the other hand, the other end 83 of the first wiring 11 drawn out from the second opening 3 is connected to third wiring 31.

The second wiring 21 is wound around the magnetic core 1 in a manner running through the through-hole 1A. An end 84 of the second wiring 21 drawn out from the second opening 3 side is connected to the third wiring 31. On the other hand, the other end of the second wiring 21 drawn out from the first opening 2 forms a filter output end 82. The first wiring 11 and the second wiring 21 are connected by connecting the other end 83 of the first wiring 11 and the one end 84 of the second wiring 21 to the third wiring 31. The first capacitor 41 is connected between the third wiring 31 and the ground. Further, the second capacitor 51 is connected between the second wiring 21 and the ground on the filter output end 82 side of the second wiring 21.

Next, an operation principle of the noise filter 140 of the present embodiment will be described using FIG. 3. A DC component and an AC component are contained in current received in the filter input end 81, but a description will be provided by separating the DC component from the AC component.

(DC Component)

First, the DC component will be described. Here, current flowing in the first wiring 11 is defined as $I_1$, and current flowing in the second wiring 21 is defined as $I_2$. Further, it is assumed that the number of turns of the first wiring 11 is same as the number of turns of the second wiring 21. The DC component of the current $I_1$ flowing in the first wiring 11 generates a magnetic flux $\Phi_{DC1}$ inside the magnetic core 1. The DC component of current flowing from the other end 83 of the first wiring 11 to the third wiring 31 flows to the second wiring 21 from the one end 84 of the second wiring 21 without being split to the first capacitor 41 connected to the third wiring 31. The DC component of the current $I_2$ flowing in the second wiring 21 generates a magnetic flux $\Phi_{DC2}$ inside the magnetic core 1.

The current flowing in the first wiring 11 flows in a direction of the second opening 3 from the first opening 2 inside the through-hole 1A. Therefore, a direction of the magnetic flux $\Phi_{DC1}$ is a direction indicated by an arrow in the drawing. On the other hand, the current flowing in the second wiring 21 flows in a direction of the first opening 2 from the second opening 3 inside the through-hole 1A. Therefore, a direction of the magnetic flux $\Phi_{DC2}$ is a direction opposing to the direction of the magnetic flux $\Phi_{DC1}$. Further, the DC component of the current $I_1$ has the same value as the DC component of the current $I_2$, and further the number of turns of the first wiring 11 is same as the number of turns of the second wiring 21. Therefore, the magnetic fluxes $\Phi_{DC2}$ and $\Phi_{DC1}$ have equal intensity (magnetic flux density). As a result, a combined magnetic flux of the magnetic flux $\Phi_{DC1}$ and the magnetic flux $\Phi_{DC2}$ becomes zero inside the magnetic core 1. In other words, the magnetic flux generated by the DC component inside the magnetic core 1 is zero regardless of intensity of AC current, and magnetic saturation caused by the case of having a large amount of AC components (high DC current) is prevented from occurrence. Therefore, there is no need to enlarge the size for saturation control and the magnetic core 1 can be downsized.

(AC Component)

Next, the AC component will be described. The AC component of the current $I_1$ flowing in the first wiring 11 generates the magnetic flux $\Phi_{AC1}$ inside the magnetic core 1. Some of AC components of the current flowing from the other end 83 of the first wiring 11 to the third wiring 31 (indicated by reference sign $I_3$ in FIG. 3) is split to the first capacitor 41 connected to the third wiring 31. Therefore, the amount of AC components flowing into the second wiring 21 from the third wiring 31 is reduced. The AC component of the current flowing in the second wiring 21 generates the magnetic flux $\Phi_{AC2}$ inside the magnetic core 1. As is the case with the magnetic fluxes $\Phi_{DC1}$ and $\Phi_{DC2}$ generated by the above-described DC components, the direction of the magnetic flux $\Phi_{AC1}$ is opposite to the direction of the magnetic flux $\Phi_{AC2}$, but these magnetic fluxes have different intensity from each other. Due to this, a combined magnetic flux of the magnetic flux $\Phi_{AC1}$ and the magnetic flux $\Phi_{AC2}$ does not become zero, and the first wiring 11 and the second wiring 21 wound around the magnetic core 1 function as inductors against the AC components. Further, a function as a noise filter (LC filter) can be achieved by combining these with the second capacitor 51 connected to the second wiring 21.

Figure 4:
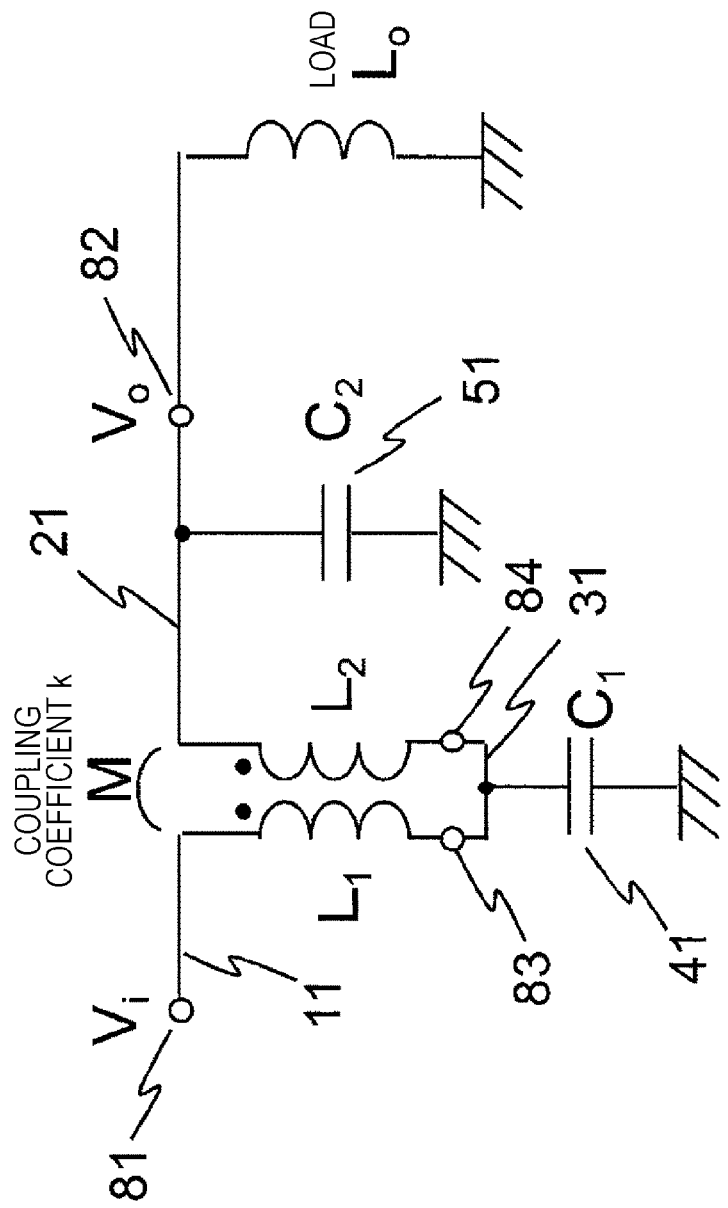
FIG. 4 is a diagram illustrating an equivalent circuit of the above-mentioned noise filter 140.
Figure 5:
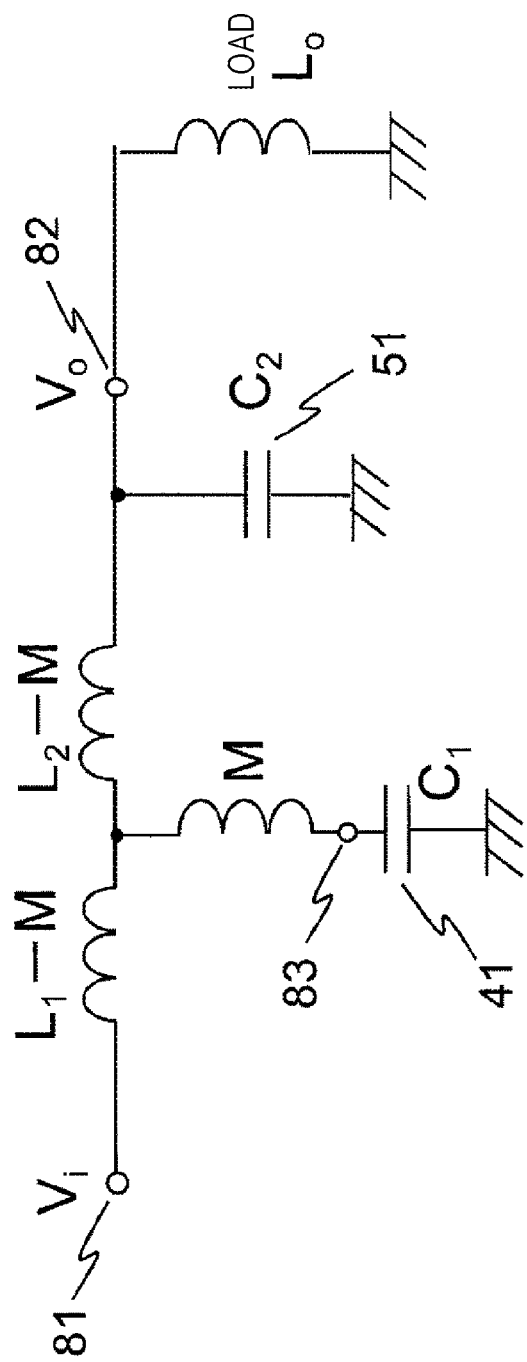
FIG. 5 is a diagram illustrating an equivalent circuit of the noise filter 140 in the case of using a T-type equivalent circuit.

FIG. 4 is a diagram illustrating an equivalent circuit of the above-described noise filter 140. At the filter output end 82, Lo is connected as a load. The equivalent circuit in FIG. 4 can perform conversion by using a T-type equivalent circuit of a transformer as illustrated in FIG. 5. Here, study will be made on a case where L1=L2=3 μH, coupling coefficient k=0.9, C1=C2=50 μF, and LO=5 μH. In this case, L1−M<M is established because: L1−M=L2−M=(1−k)L1, and M=kL1.

Figure 6:
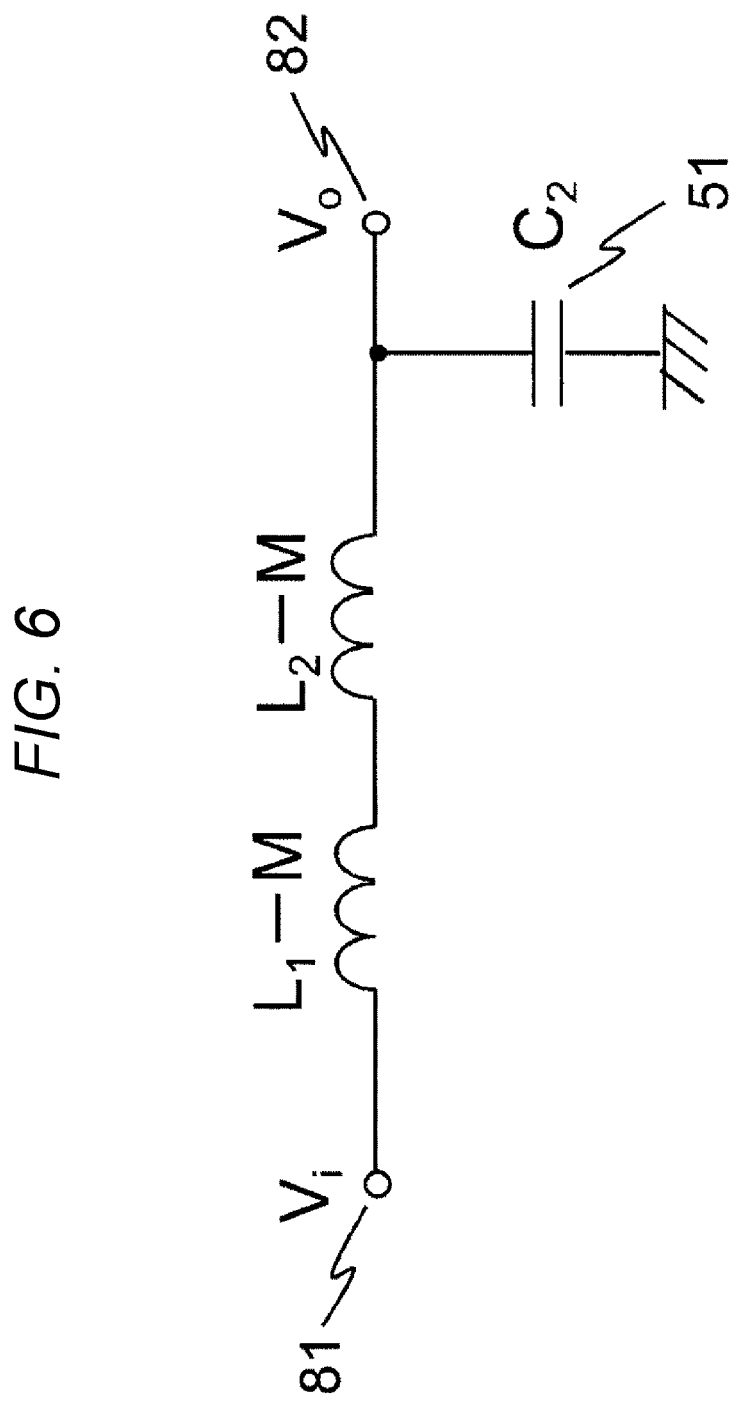
FIG. 6 is a diagram illustrating a simple equivalent circuit of the noise filter 140.
Figure 7:
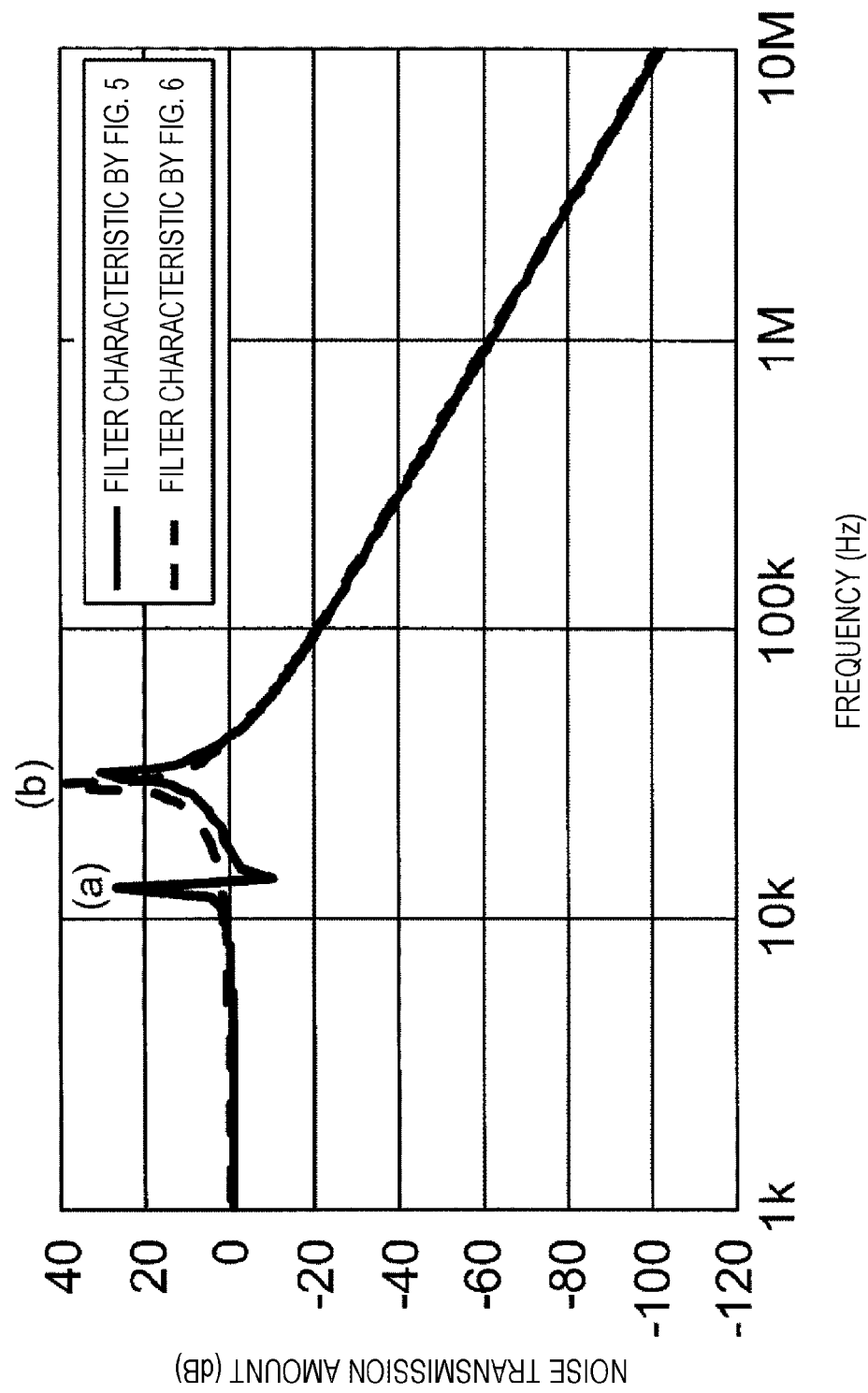
FIG. 7 is a diagram illustrating noise transmission amounts calculated by the equivalent circuits in FIGS. 5 and 6.

Further, in the case of considering a frequency area where impedance of the load $L_o$ is larger than impedance of the second capacitor 51, the equivalent circuit diagram illustrated in FIG. 5 can be transformed to a simple equivalent circuit diagram illustrated in FIG. 6. FIG. 7 is a diagram illustrating noise transmission amounts calculated by the equivalent circuits in FIGS. 5 and 6. Note that the noise transmission amount is expressed by an absolute value of a ratio |Vo/Vi| between input voltage Vi and output voltage Vo of the noise filter.

In FIG. 7, a solid line represents the noise transmission amount calculated by the equivalent circuit diagram in FIG. 5, and a dotted line represents the amount of transmitted noise calculated by the simple equivalent circuit in FIG. 6. Judging from FIG. 7, a function as the noise filter is confirmed because the noise transmission amount is suppressed to 0 dB or less when the frequency is 40 kHz or more. Further, when the frequency is 40 kHz or more, results of the respective noise transmission amounts calculated from the equivalent circuit diagrams in FIGS. 5 and 6 are the same, and it is found that the noise transmission amount can be calculated by the simple equivalent circuit diagram in FIG. 6. On the other hand, when the frequency is 40 kHz or less, the noise transmission amount is 0 dB or 0 dB or more, and it is found that the function as the noise filter is available. Particularly, noise peaks caused by circuit resonance are observed near the frequency 14 kHz indicated by reference sign (a) and 30 kHz indicated by reference sign (b) in FIG. 7.

The noise peak (a) is formed by series resonance generated in mutual inductance M between the first wiring 11 and the second wiring 21, and the first capacitor C1, and a resonance frequency fa can be calculated by a following formula (1).

[Mathematical Formula 1]

$$f_a = \frac{1}{2\pi\sqrt{M \cdot C_1}} \quad (1)$$

Further, the noise peak (b) is almost same as a series resonance frequency fb generated in two inductors (L1-M) and (L2-M) and the second capacitor C2 in the simple equivalent circuit of FIG. 6. Here, the resonance frequency fb can be calculated by a following formula (2). By this, the function as the noise filter can be achieved at a desired frequency or more by adjusting a parameter of a circuit element.

[Mathematical Formula 2]

$$f_b = \frac{1}{2\pi\sqrt{(L_1 + L_2 - 2M) \cdot C_2}} \quad (2)$$

Second Embodiment

In a power converter according to a second embodiment, a power conversion circuit 101 is same as a first embodiment illustrated in FIG. 1, and only a configuration of a noise filter 140 differs from a power converter of the first embodiment. Therefore, in the following, only the noise filter 140 will be described.

Figure 8:
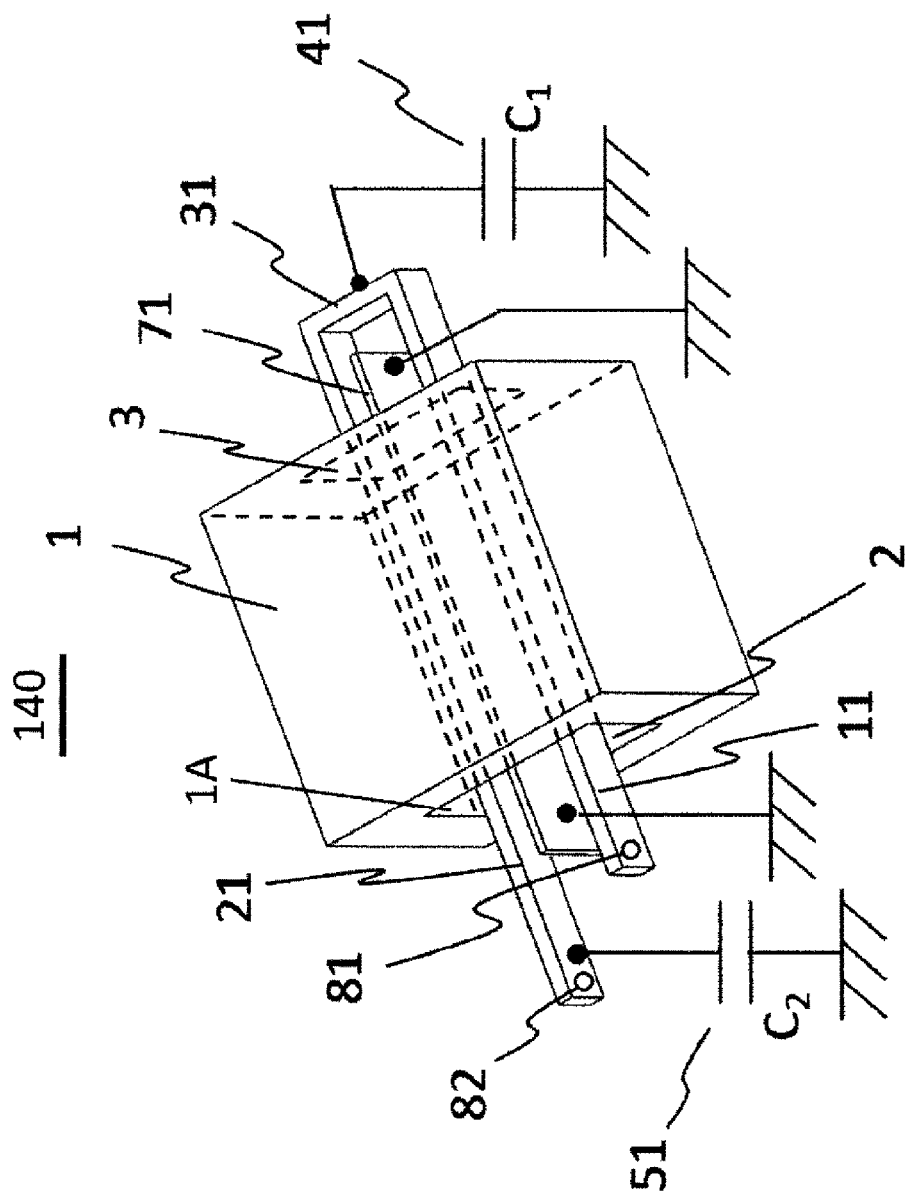
FIG. 8 is a perspective view illustrating a noise filter 140 according to a second embodiment.

FIG. 8 is a perspective view illustrating the noise filter 140 according to the second embodiment. In the present embodiment, a member formed by molding a flat bar-shaped member in a U-shape is used as first wiring 11, second wiring 21, and third wiring. A magnetic core 1 having a rectangular cylinder shape is formed with a through-hole 1A having a rectangular cross-sectional surface. The first wiring 11 is arranged so as to run through the through-hole 1A from a first opening 2 to a second opening 3. A filter input end 81 of the first wiring 11 projecting from the first opening 2 is connected to an output end of a low-voltage side rectifier circuit 130 illustrated in FIG. 1. On the other hand, the other end side of the first wiring 11 projecting from the second opening 3 is integrally connected to the third wiring 31.

The second wiring 21 is arranged so as to run through the through-hole 1A from the second opening 3 to the first opening 2. An end of the second wiring 21 projecting from the second opening 3 is integrally connected to the third wiring 31. On the other hand, a second capacitor 51 is connected between ground and the other end (filter output end 82) of the second wiring 21 projecting from the first opening 2. Further, a first capacitor 41 is connected between the third wiring 31 and the ground.

The first wiring 11 and the second wiring 21 are substantially arranged in parallel, and a shield plate 71 is disposed between the first wiring 11 and the second wiring 21 in parallel thereto. The shield plate 71 is connected to the ground. By providing this shield plate 71, an electric filed on the first wiring 11 side can be separated and blocked from an electric field of the second wiring 21 side. In other words, the shield plate 71 functions as a shield to suppress electric field coupling.

In the case where there is electric field coupling between the first wiring 11 and the second wiring 21, part of noise flowing from the filter input end 81 is transmitted from the first wiring on an input side to the second wiring 21 arranged adjacent thereto via the electric field without passing through the inside of the wiring 11, 21 that are inductors. As a result, a noise attenuation effect of the noise filter 140 is deteriorated. However, the first wiring 11 and the second wiring 21 are electrostatically shielded by providing the shield plate 71, and noise transmission by electric field coupling is prevented. Therefore, the noise attenuation effect can be secured.

Figure 9:
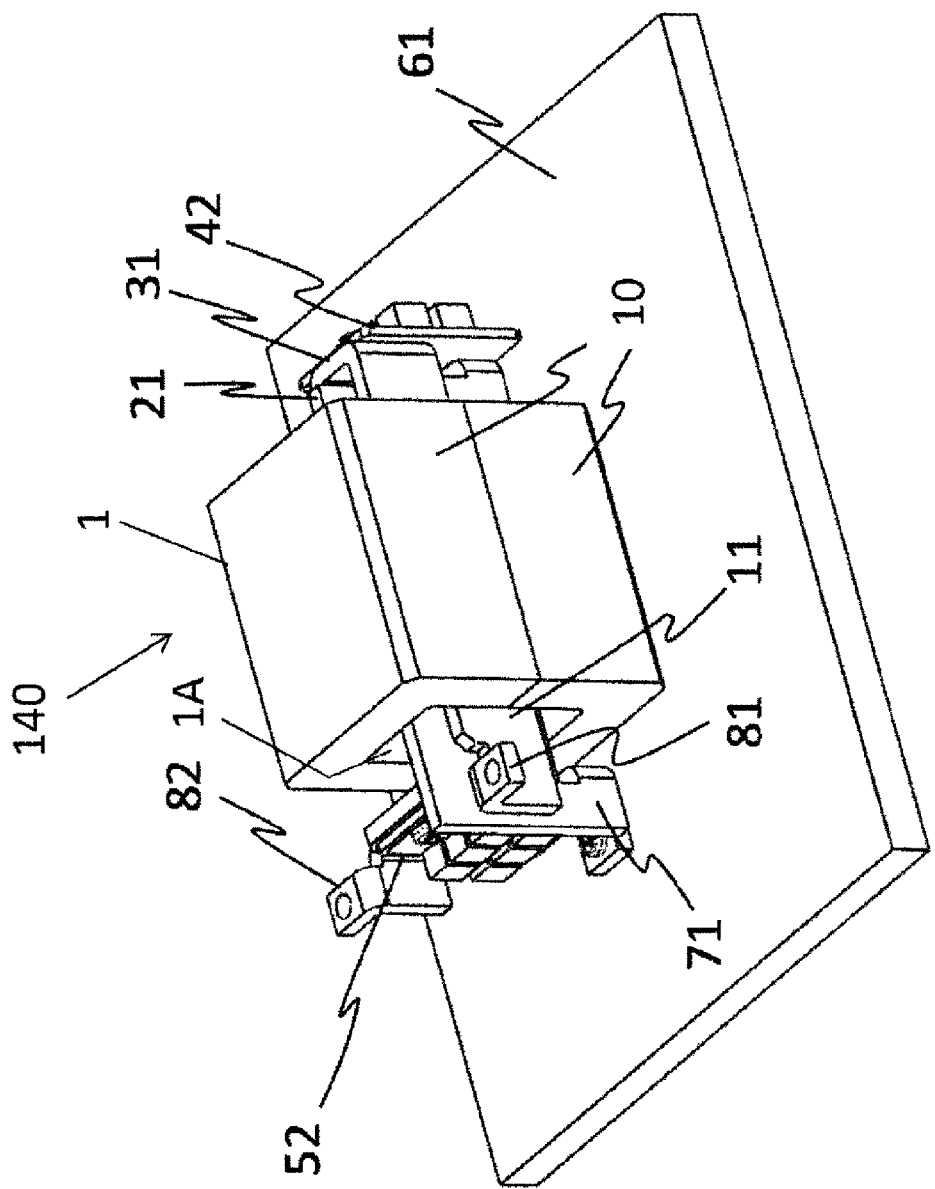
FIG. 9 is an external perspective view illustrating an example of the noise filter 140.
Figure 10:
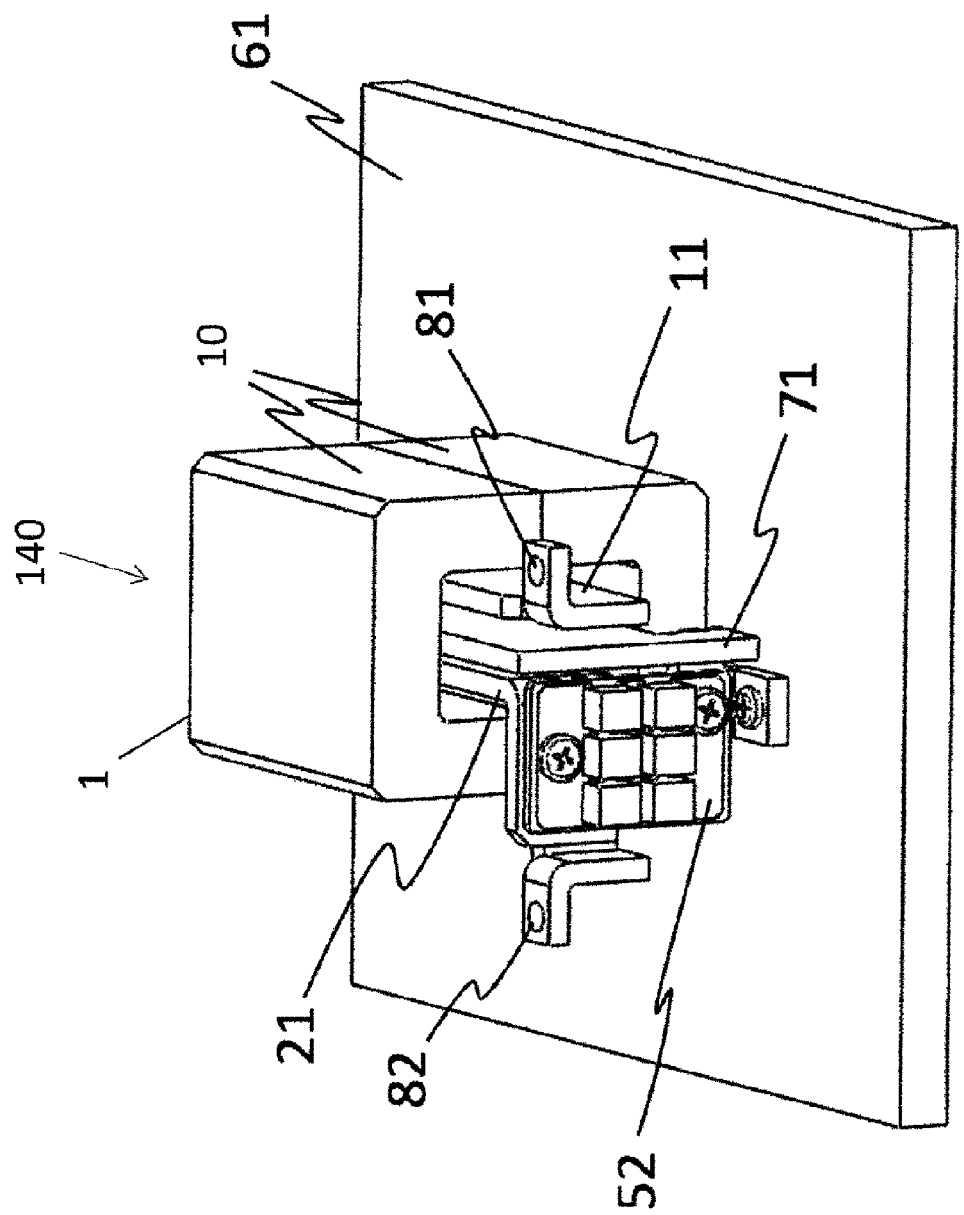
FIG. 10 is an external perspective view illustrating an example of the noise filter 140.

FIGS. 9 to 12 are diagrams illustrating exemplary implementation of the noise filter 140 illustrated in FIG. 8. FIGS. 9 and 10 are external views of the noise filter 140 fixed to a ground plate 61 having a plate-like shape. The magnetic core 1 is formed of a plurality of core members or an integrated core member. In the example illustrated in FIG. 9, the magnetic core 1 is formed of two core members 10 each having a U-shape cross-sectional surface. The first wiring 11, second wiring 21, and shield plate 71 are inserted and made to pass through the inside of the through-hole 1A of the magnetic core 1. The first capacitor 41 is mounted on a first capacitor substrate 42 disposed on the third wiring 31 side. The second capacitor 51 is mounted on a second capacitor substrate 52 disposed on a side where the filter input end 81 and the filter output end 83 of the wiring 11, 21 are provided.

Figure 11:
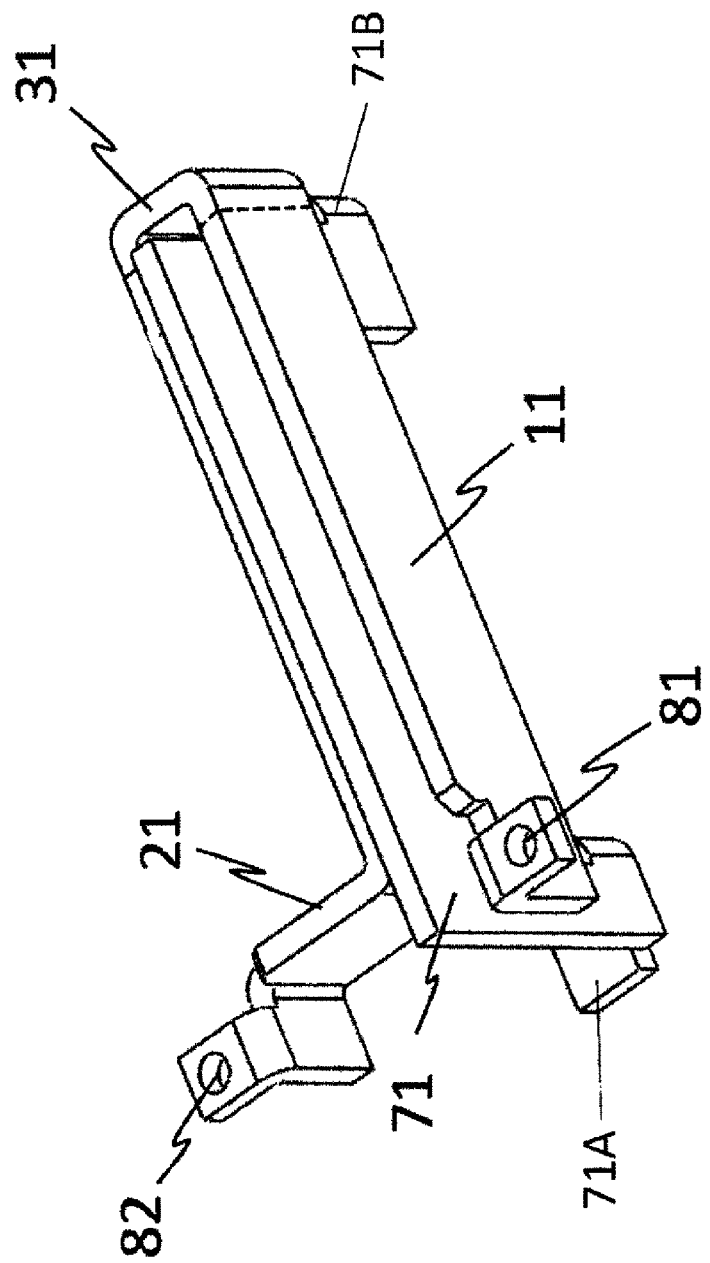
FIG. 11 is an external perspective view illustrating wiring 11, 21, 31 and a shield plate 71.

FIG. 11 is an external perspective view illustrating the wiring 11, 21, 31 and the shield plate 71. The first wiring 11, second wiring 21, and third wiring 31 are integrally formed in a bus bar (bar-like or plate-like conductive member) molded in the U-shape. The filter input end 81 and the filter output end 82 are formed on both ends of the bus bar. A portion of the first wiring 11 and a portion of the second wiring 21 are arranged substantially in parallel interposing a gap, and the shield plate 71 is disposed in the gap.

At both ends of the shield plate 71, namely, portions projected to the outside of the through-hole 1A, fixing portions 71A, 71B each bent in an L-shape are formed. The shield plate 71 is fixed to the ground plate 61 by fixing the fixing portions 71A, 71B on the ground plate 61 with screws (refer to FIGS. 9 and 10). As a result, the shield plate 71 is electrically connected to the ground plate 61.

Figure 12:
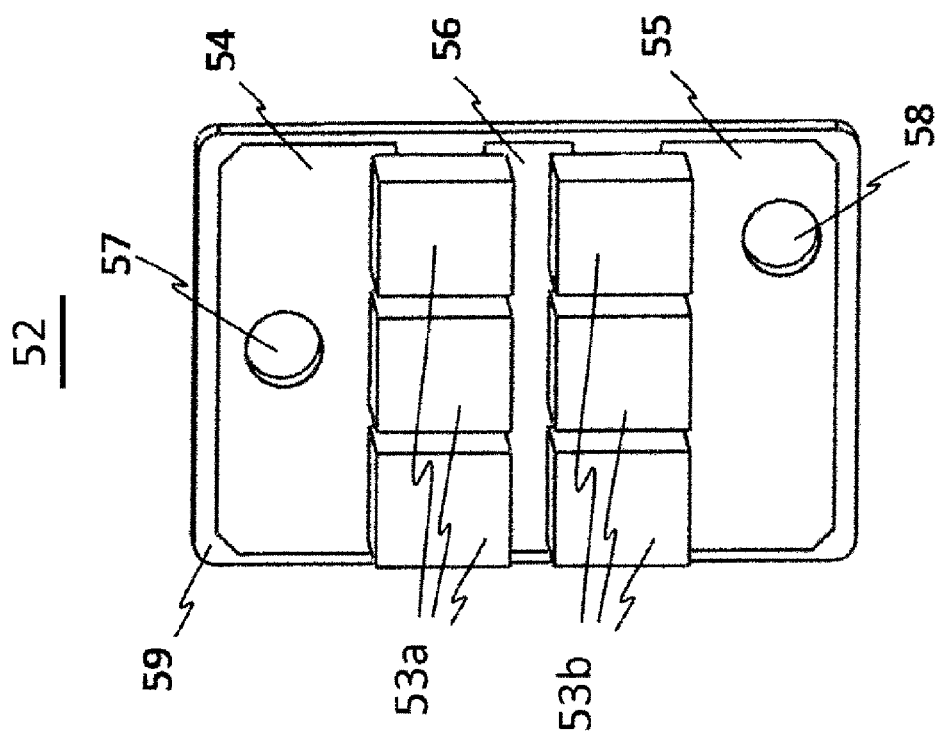
FIG. 12 is an enlarged view of a second capacitor substrate 52 mounted with a second capacitor 51.

FIG. 12 is an enlarged view of the second capacitor substrate 52 mounted with the second capacitor 51. The second capacitor substrate 52 is formed by mounting capacitors 53a, 53b on a print circuit board 59 formed with an output terminal side wiring pattern 54, a ground side wiring pattern 55, and an intermediate wiring pattern 56. A plurality of the capacitors 53a is connected in parallel between the output terminal side wiring pattern 54 and the intermediate wiring pattern 56. In the same manner, a plurality of the capacitors 53b is arranged in parallel between the intermediate wiring pattern 56 and the ground side wiring pattern. In the case of the example illustrated in FIG. 12, three capacitors 53a, 53b are provided respectively. The above-described second capacitor 51 is formed of these capacitors 53a, 53b.

A through-hole 57 is formed on a portion of the output terminal side wiring pattern 54, and the portion of the output terminal side wiring pattern 54 is fixed to the second wiring 21 with a screw as illustrated in FIG. 10. As a result, the output terminal side wiring pattern 54 and the second wiring 21 are electrically connected via the screw. In the same manner, a through-hole 58 is formed also on a portion of the ground side wiring pattern 55, and the portion of the ground side wiring pattern 55 is fixed to the shield plate 71 with a screw, thereby electrically connecting the ground side wiring pattern 55 to the shield plate 71 via the screw.

While detailed illustration is omitted, the first capacitor substrate 42 mounted with the first capacitor 41 also has the same structure as the second capacitor substrate 52. Further, a portion of an input terminal side wiring pattern formed on the first capacitor substrate 42 is fixed to the third wiring 31 with a screw, and a portion of the ground side wiring pattern formed on the first capacitor substrate 42 is fixed to the shield plate 71 with a screw. With this structure, assembly efficiency of the noise filter can be improved.

According to the above-described embodiment, as illustrated in FIG. 8, the noise filter 140 disposed on a direct current side of the power conversion circuit 101 and adapted to remove noise includes: the magnetic core 1 formed with the single through-hole 1A and forming a closed magnetic circuit; the first wiring 11 having one end 81 connected to the power conversion circuit 101 and the other end 83 drawn out from the second opening 3, and running through the through-hole 1A from the first opening 2 to the other second opening 3; the second wiring 21 having one end 84 connected to the other end 83 of the first wiring 11 and the other end 82 drawn out from the first opening 2 as the filter output end, and running through the through-hole 1A from the second opening 3 to the first opening 2; the first capacitor 41 provided between the ground and a connecting portion of the first wiring 11 and the second wiring 21; and the second capacitor 51 provided between the other end 82 of the second wiring 21 and the ground.

Meanwhile, in the example illustrated in FIG. 8, the one end of the second wiring 21 and the other end of the first wiring 11 are connected via the third wiring 31 functioning as the connecting portion. Further, the first capacitor 41 is provided between the third wiring 31 and the shield plate 71 set to ground potential.

Figure 3:
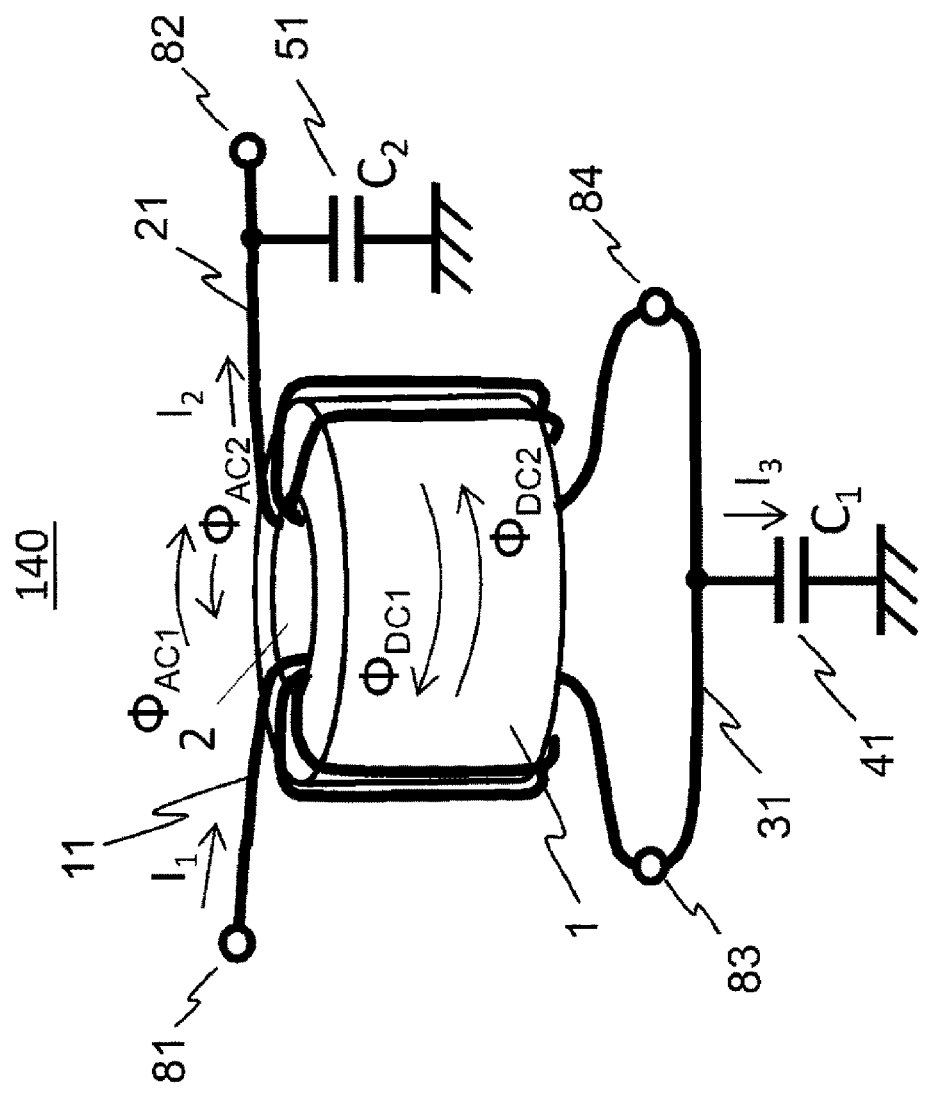
FIG. 3 is a diagram illustrating an operation principle of the noise filter 140.

By thus forming the noise filter 140, magnetic fluxes $\Phi_{AC1}$, $\Phi_{DC1}$ are formed by current flowing in the first wiring 11 and magnetic fluxes $\Phi_{AC2}$, $\Phi_{DC2}$ are formed by current flowing in the second wiring 21 inside the magnetic core 1 as illustrated in FIG. 3. In other words, the first wiring 11, second wiring 21, and first capacitor 41 are wired to the magnetic core 1 such that the magnetic flux $\Phi_{DC1}$ and the magnetic flux $\Phi_{DC2}$ by the DC components cancel each other and become substantially zero. Further, some of AC components are split to the ground side by the first capacitor 41. Therefore, the magnetic flux absolute value of the magnetic flux $\Phi_{AC1}$ is larger than the magnetic flux $\Phi_{AC2}$ and a function as the noise filter is achieved.

As a result, the magnetic core 1 can be prevented from magnetic saturation caused by high DC current, and the magnetic core 1 can be more downsized than that of the related art, and the power converter 100 mounted with the downsized noise filter 140 can be provided. Further, in addition to the second capacitor 51 provided on the filter output end 82 side, the first capacitor 41 is provided at the connecting portion of the first wiring 11 and the second wiring 21, thereby achieving a function as an LC filter for the AC components.

Figure 13:
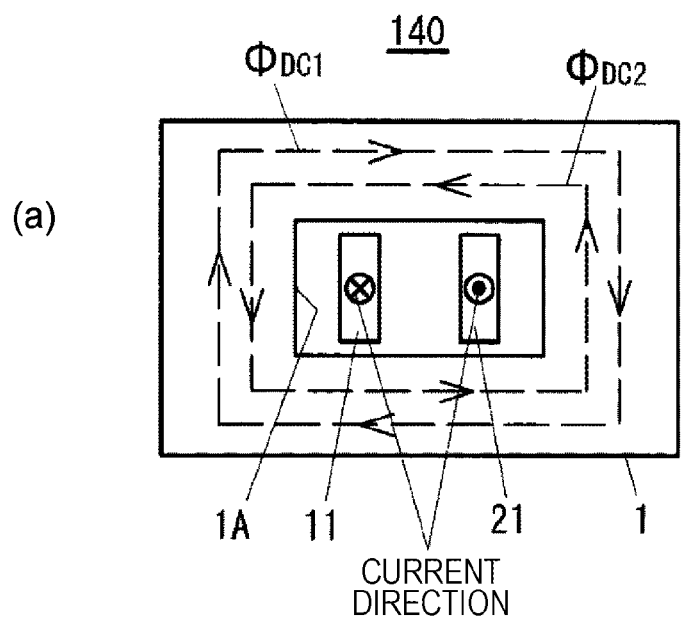
FIGS. 13(*a*) and 13(*b*) are explanatory diagrams comparing the noise filter 140 according to the present invention with a noise filter 240 of the related art.
Figure 13:
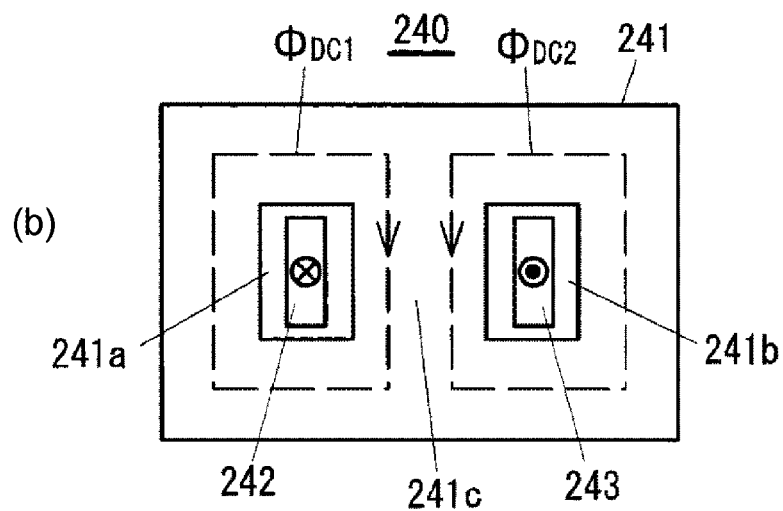

FIGS. 13(*a*) and 13(*b*) are diagrams schematically illustrating magnetic fluxes of DC components formed on a magnetic core in the noise filter 140 according to the present invention and a noise filter 240 in the related art disclosed in PTL 1 described above. FIG. 13(*a*) is the case of the present invention, and same as the one illustrated in FIG. 3. FIG. 13(*b*) is the case of the noise filter 240 in the related art. In FIGS. 13(*a*) and 13(*b*), a direction of current flowing in wiring 11, 242 is the direction toward a back surface orthogonal to a drawing paper, and a direction of current flowing in wiring 21, 243 is the direction toward a front surface of the drawing paper. Therefore, a direction of the magnetic flux $\Phi_{DC1}$ is clockwise, and a direction of the magnetic flux $\Phi_{DC1}$ is anti-clockwise.

In the noise filter 240 illustrated in FIG. 13(*b*), two through-holes 241*a*, 241*b* are formed at the magnetic core 241. Wiring 242 is disposed in the through-hole 241*a* on one side, and wiring 243 is disposed in the other through-hole 241*b* on the other side. Therefore, both magnetic fluxes $\Phi_{DC1}$, $\Phi_{DC2}$ are concentrated in a magnetic core portion 241*c* between the through-holes 241*a*, 241*b*, and in the case of having high DC current, magnetic saturation is likely to occur. On the other hand, in the noise filter 140 according to the present invention illustrated in FIG. 13(*a*), current directions of the wiring 11, 21 arranged inside the single through-hole 1A are opposite from each other. Therefore, as described above, the magnetic fluxes $\Phi_{DC1}$, $\Phi_{DC2}$ cancel each other inside the magnetic core 1. As a result, magnetic saturation can be prevented from occurrence.

Further, as illustrated in FIG. 8, the shield plate 71 disposed between the first wiring 11 and the second wiring 21 so as to pass through the through-hole 1A and adapted to prevent the first wiring 11 and the second wiring 21 from electric field coupling is provided. By this, noise transmission from the first wiring 11 to the second wiring 21 caused by electric field coupling can be prevented, and the attenuation effect of the noise filter 140 can be secured. Meanwhile, the same effect can be provided by disposing a shield member for electric field coupling prevention between the first power distribution 11 and the second wiring 21 even in the case where the wiring 11 and 21 are wound around in a coil-like form as illustrated in FIG. 2.

Further, as illustrated in FIGS. 2 and 3, in the case where the noise filter 140 has a structure in which a conductor line is wound around the magnetic core 1, the first wiring 11 drawn out from the second opening 3 is wound around the magnetic core 1 so as to run through the through-hole 1A, and then connected to the one end 84 of the second wiring 21 (in FIGS. 2 and 3, connected to the one end 84 via the wiring 31). On the other hand, the second wiring 21 drawn out from the first opening 2 is wound around the magnetic core 1 so as to run through the through-hole 1A, and then connected to the second capacitor 51.

Meanwhile, in the example illustrated in FIG. 2, the noise filter is formed to have the structure in which the first wiring 11 and the second wiring 21 are respectively wound around the magnetic core 1 twice, but the effects is provided by optional number of turns, not limited to the above-mentioned number of turns. Further, when the number of turns of the first wiring 11 is made same as the number of turns of the second wiring 21, the magnetic flux by the DC components (obtained by adding the magnetic flux with the magnetic flux) can be made to substantially zero, but not necessarily to be the same. Even when the number of turns is different between the both wiring, the magnetic flux by the DC components can be made little when the difference is small, and magnetic saturation can be prevented from occurrence in the case of having high DC current.

Further, as illustrated in FIG. 11, the first and second wiring 11 and 12 can be formed integrally by the U-shaped conductive member (bus bar) in which both ends of the two parallel portions are mutually connected at the bent portion, and the one parallel portion may be set as the first wiring 11 and the other parallel portion may be set as the second wiring 21. In this case, the first capacitor 41 is provided so as to connect the bent portion (third wiring 31) of the conductive member to the ground. With this structure, assembly efficiency can be more improved compared to the wound wire type illustrated in FIG. 2.

Further, the first capacitor substrate 42 is formed with the input terminal side wiring pattern connected to the third wiring 31, and includes a first print board mounted with the first capacitor 41 so as to be connected to the input terminal side wiring pattern. Further, as illustrated in FIG. 12, the second capacitor substrate 52 is formed with the output terminal side wiring pattern 54 connected to the second wiring 21, and includes the print circuit board 59 mounted with the capacitors 53*a*, 53*b* constituting the second capacitor 51 so as to be connected to the output terminal side wiring pattern 54. Further, the first print board is fixed to the third wiring 31 such that the input terminal side wiring pattern is electrically connected to the third wiring 31, and the print circuit board 59 is fixed to the second wiring 21 such that the output terminal side wiring pattern 54 is electrically connected to the second wiring 21. With this structure, assembly efficiency of the noise filter can be further improved.

Moreover, assembly efficiency of the noise filter 140 can be improved by forming the magnetic core 1 from the plurality of core members 10 made of magnetic material. In the example illustrated in FIG. 9, a width size between both ends of the shield plate 71 is larger than a diameter size of the through-hole 1A. Therefore, the cylindrical magnetic core 1 is formed of the two core members 10 having half-cut structure. In the example illustrated in FIG. 9, the magnetic core 1 is divided by a dividing surface parallel to an axis of the magnetic core 1, but may also be divided into a plurality of portions by surfaces orthogonal to the axis. Meanwhile, since the dividing surface is formed in a manner cutting across a magnetic path in the magnetic core 1 illustrated in FIG. 9, the dividing surfaces of the core members 10 facing each other at a jointing portion are preferably the same.

Meanwhile, according to the above-described embodiments, a full-bridge switching circuit system illustrated in FIG. 1 is exemplified as a high-voltage side switching circuit system, but in the case of adopting a half-bridge switching system or another type of the switching system as a circuit system, the effects of the above-described noise filter 140 can also be provided in the same manner. Further, in the case of adopting a diode rectification system or another type of the rectification system as a circuit system of the low-voltage side rectifier circuit instead of a synchronous rectification system illustrated in FIG. 1, the effects of the above-described noise filter 140 can also be provided in the same manner. Further, needless to mention, there are various possible ways of combining the above-described high-voltage side switching circuit system with the low-voltage side rectifier circuit system. Additionally, according to the above-described embodiments, the example of DC-DC converter device has been described, but not limited thereto, various kinds of power converters provided with a noise filter can be applied.

Note that the present invention is not limited to the above-described embodiments and may include various modified examples. For example, the above-described embodiments are described in detail in order to clearly explain the present invention, and are not necessarily limited to those having all the components described. Additionally, some components of one embodiment can be partly replaced with components of another embodiment, and further a component of another embodiment can also be added to components of one embodiment. Further, addition, deletion, and substitution of other components can be made to part of the components of the respective embodiments.

REFERENCE SIGNS LIST 1 magnetic core
1A through-hole
11 first wiring
21 second wiring
31 third wiring
41 first capacitor
42 first capacitor substrate
51 second capacitor
52 second capacitor substrate
54 output terminal side wiring pattern
55 ground side wiring pattern
61 ground plate
71 shield plate
100 DC-DC converter device
101 power conversion circuit
110 high-pressure side switching circuit
120 transformer
130 low-pressure side rectifier circuit
140 noise filter

The invention claimed is:

1. A power converter, comprising:
a switching circuit for power conversion including a switching device; and
a noise filter provided on a direct current side of the switching circuit and configured to remove noise,
wherein the noise filter includes:
a magnetic core formed with a single through-hole and forming a closed magnetic circuit;
first wiring having one end connected to the switching circuit and the other end drawn out from a second opening, and running through the through-hole from one first opening to the other second opening, configured to induce a first magnetic flux in the magnetic circuit attributable to a direct-current component of a current that flows into the first wiring;
second wiring having one end connected to the other end of the first wiring and the other end drawn out from the first opening as a filter output end, and running through the through-hole from the second opening to the first opening, configured to induce a second magnetic flux in the magnetic circuit attributable to the direct-current component, the second magnetic flux being of equal intensity to the first magnetic flux;
a first capacitor provided between ground and a connecting portion of the first wiring and the second wiring;
a second capacitor provided between the other end of the second wiring and the ground,
a bar-like or plate-like conductive member bent in a U-shape, the conductive member including a first parallel portion as the first wiring, a second parallel portion as the second wiring, and a bent portion configured to connect an end of the first parallel portion with an end of the second parallel portion,
a first print board formed with a first conductive pattern connected to the bent portion and mounted with the first capacitor so as to be connected to the first conductive pattern; and
a second print board formed with a second conductive pattern connected to the second parallel portion and mounted with the second capacitor so as to be connected to the second conductive pattern,
wherein the first print board is fixed to the bent portion such that the first conductive pattern is electrically connected to the bent potion,
the second print board is fixed to the second parallel portion such that the second conductive pattern is electrically connected to the second parallel portion, and
wherein the first capacitor is provided between the bent portion and the ground.

2. The power converter according to claim 1, including a shield member disposed between the first wiring and the second wiring so as to pass through the through-hole, and configured to prevent the first wiring and the second wiring from electric field coupling.

3. The power converter according to claim 1, wherein
the first wiring drawn out from the second opening is wound around the magnetic core so as to run through the through-hole, and then connected to the one end of the second wiring, and
the second wiring drawn out from the first opening is wound around the magnetic core so as to run through the through-hole, and then connected to the second capacitor.

4. The power converter according to claim 1, wherein the magnetic core is formed of a plurality of core members made of magnetic material.

* * * * *